United States Patent [19]

Imaizumi et al.

[11] 4,278,987
[45] Jul. 14, 1981

[54] JUNCTION ISOLATED IC WITH THICK EPI PORTION HAVING SIDES AT LEAST 20 DEGREES FROM (110) ORIENTATIONS

[75] Inventors: Ichiro Imaizumi, Hinodemachi; Masatoshi Kimura, Hachioji; Keijiro Uehara, Tokyo, all of Japan

[73] Assignee: Hitachi, Ltd., Tokyo, Japan

[21] Appl. No.: 950,671

[22] Filed: Oct. 12, 1978

[30] Foreign Application Priority Data

Oct. 17, 1977 [JP] Japan ............................ 52-123474
Dec. 26, 1977 [JP] Japan ........................ 52-173999[U]
Aug. 28, 1978 [JP] Japan ............................ 53-103944

[51] Int. Cl.³ ............... H01L 27/04; H01L 21/302; H01L 21/20; H01L 21/76
[52] U.S. Cl. ............................ 357/48; 148/175; 156/647; 357/55; 357/60; 357/20
[58] Field of Search .............. 357/50, 55, 56, 60, 357/48, 20; 148/175; 156/647

[56] References Cited
U.S. PATENT DOCUMENTS

| | | | |
|---|---|---|---|
| 3,728,166 | 4/1973 | Bardell, Jr. et al. | 357/60 |
| 3,764,409 | 10/1973 | Nomura et al. | 357/60 |
| 3,793,712 | 2/1974 | Bean et al. | 357/60 |
| 3,986,200 | 10/1976 | Allison | 357/55 |
| 3,998,674 | 12/1976 | Cameron et al. | 357/60 |
| 4,000,019 | 12/1976 | van den Brenkel | 357/60 |
| 4,056,413 | 11/1977 | Yashimura | 357/60 |
| 4,089,021 | 5/1978 | Sato et al. | 357/55 |
| 4,141,765 | 2/1979 | Draminski et al. | 357/55 |

*Primary Examiner*—William D. Larkins
*Attorney, Agent, or Firm*—Craig & Antonelli

[57] ABSTRACT

A semiconductor device prepared by forming a silicon substrate of one conductor type having a surface of the (100) crystal plane, opening a rectangular window having sides parallel to the <100> crystal axis, etching the interior of the rectangular window with an anisotropic etching solution to form a dent, removing the oxide film and growing an epitaxial layer of a conductor type opposite to that of the substrate on the entire surface of the substrate, and masking the dent with an oxide film and etching the epitaxial layer with an anisotropic etching solution to flatten the surface of the epitaxial layer, and a method for making this semiconductor device.

7 Claims, 24 Drawing Figures

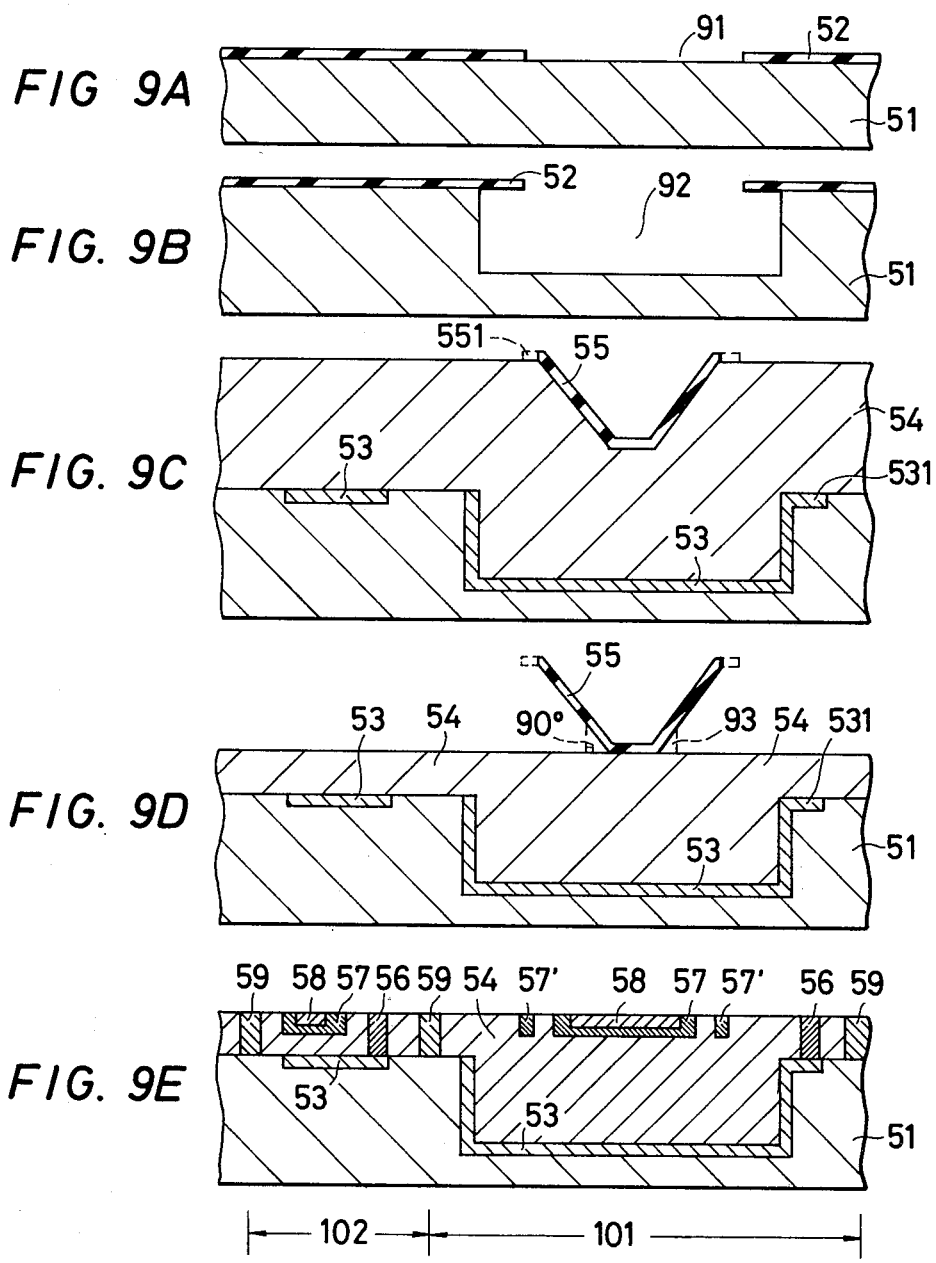

JUNCTION ISOLATED IC WITH THICK EPI PORTION HAVING SIDES AT LEAST 20 DEGREES FROM (110) ORIENTATIONS

BACKGROUND OF THE INVENTION

1. Field of the Invention

The present invention relates to a semiconductor device and a method for the preparation thereof. Particularly, the invention relates to a high-voltage semiconductor integrated circuit and a method for the preparation thereof. More particularly, the invention relates to a semiconductor device comprising a substrate and, formed thereon, an epitaxially grown layer having a flat surface but being partially different in the thickness, and a method for the preparation thereof.

2. Description of the Prior Art

A conventional semiconductor device is illustrated in FIG. 1. In the conventional integrated circuit, isolation is accomplished by applying a reverse bias to a PN junction and utilizing reverse characteristics of a PN diode. Accordingly, the upper limit of the breakdown voltage of the isolation-collector junction is controlled by the breakdown voltage of the PN junction. In FIG. 1, reference numeral 11 represents a semiconductor substrate of the P or N conductor type, reference numeral 12 represents a highly impurity-doped buried layer of the N or P conductor type, and reference numeral 13 represents a highly impurity-doped buried layer of the P or N conductor type. Reference numeral 14 represents an epitaxially grown semiconductor layer of the N or P type having a thickness $t_{EP}$, and reference numeral 15 represents a highly doped P or N type diffusion layer for isolation. Reference numeral 16 represents a silicon oxide film (SiO$_2$ film). In other FIGS. described hereinafter, these reference numerals represent the same elements. In general, it is considered that the following methods are effective for increasing the breakdown voltage of the planar type PN junction:

(1) To further reduce the impurity concentration in the lowly impurity doped region.

(2) To increase the diffusion depth in the diffusion layer.

In general, the diffusion layer 15 expands substantially in the circular form as seen from the sectional view of FIG. 2. Accordingly, if a reverse bias is applied to this PN junction, the intensity of the electric field in this circular portion is increased, and the breakdown voltage is determined by this circular portion. As the diffusion depth of the diffusion layer is increased, the concentration of the electric field in this circular portion is weakened, and hence, the breakdown voltage is improved.

(3) To form external elements such as a field plate FP and a field limiting ring FLR around the diffusion layer 32 as shown in FIG. 3.

Problems caused when the foregoing means are applied to the conventional integrated circuit having a structure as shown in FIG. 1 will now be discussed.

The resistivity and thickness of the epitaxially grown N type layer are determined by the breakdown voltage of a transistor formed therein. The voltage $BV_{CEO}$ between the collector and emitter of the transistor is determined from a maximum voltage $V_{CCMAX}$ applied to the circuit (in general, the relation of $V_{CCMAX}=BV_{CEO}$ is established), and the breakdown voltage $BV_{CBO}$ between the base and collector is determined from the current gain $h_{FE}$ and $BV_{CEO}$ (in general, the relation of $$BV_{CEO} = \frac{BV_{CBO}}{\sqrt[4]{h_{FE}}}$$

is established). Since $BV_{CBO}$ is the breakdown voltage of the PN junction between the base and collector, the minimum resistivity $\rho_{EPMIN}$ of the epitaxial layer is determined from the value of $BV_{CBO}$. In general, a value $\rho_{EP}$ higher than $\rho_{EPMIN}$ is set appropriately from the viewpoint of the deviation of the diffusion depth caused in the preparation steps and the influences of the surface.

When the value $\rho_{EP}$ is thus set, the thickness $t_{EP}$ of the epitaxial layer is then determined. The minimum value $t_{EPMIN}$ of this thickness corresponds to the width of a depletion layer which extends from the base-collector junction toward the epitaxial layer when a maximum voltage is applied in the state where the resistivity is at the maximum value $\rho_{EPMAX}$, and the thickness $t_{EP}$ is determined in view of the deviation caused in the preparation steps.

From the foregoing illustration, it will readily be understood that in order to increase the breakdown voltage, it is necessary to heighten $\rho_{EP}$ and increase $t_{EP}$. From FIG. 1, it will readily be understood that if $t_{EP}$ is increased, it is necessary to increase the diffusion depth of the diffusion layer 15 of the P+ type for isolation. When the diffusion depth is increased, expansion of the diffusion layer 15 for isolation in the lateral direction is increased as shown in FIG. 2 and the occupying area of the diffusion layer is increased. For example, in case of an integrated circuit having a breakdown voltage of 150 V, $t_{EP}$ is about 35 μm and $\rho_{EP}$ is about 15 Ω−cm, and even if isolation is accomplished by the diffusion layer and buried layer as shown in FIG. 2, the diffusion depth $x_1$ of the layer 15 is about 25 μm and an additional area corresponding to this value becomes necessary for isolation. Further, as a result of increase of the $\rho_{EP}$ value, the expansion $x_2$ of the depletion layer 21 shown in FIG. 2 becomes about 30 μm, and therefore, an additional area corresponding to 30 to 40 μm is necessary for the isolation region as compared with a low breakdown voltage integrated circuit.

When a high breakdown voltage integrated circuit is actually prepared, in general, the number of isolation islands on which elements actually requiring a high breakdown voltage are formed is usually small. Also the area necessary for such low breakdown voltage isolation is substantially the same as described above, and such increase of the area annuls the significance of an integrated circuit from the economical viewpoint.

The problem concerning low breakdown voltage portions is that the series resistance $r_{SC}$ of the collector of the transistor is greatly increased because $\rho_{EP}$ is heightened and the thickness $t_{EP}$ is increased. For example, the emitter area of a transistor customarily used for a low breakdown voltage integrated circuit is about 20 μm×20 μm, and $\rho_{EP}$ is 1.5Ω−cm and $t_{EP}$ is about 10 μm. If it is intended to realize a transistor having the same $r_{SC}$ value under the above-mentioned conditions of $\rho_{EP}=15Ω-cm$ and $t_{EP}\approx35$ μm, it is necessary to increase the emitter area. Namely, an emitter area of 120 μm×120 μm, 35 times the above emitter area, becomes necessary. Accordingly, realization of an integrated circuit becomes difficult from the economic viewpoint.

As means for overcoming the foregoing disadvantages, there has been proposed a structure shown in the sectional view of FIG. 4 (see Japanese Patent Publication No. 48955/1976). This structure is characterized in that the thickness of the epitaxial layer 14 differs in a high breakdown voltage element-forming portion 14-1 and a low breakdown voltage element-forming portion 14-2 and the diffusion layer 15 for isolation can be formed in the thin portion. In this structure, since a low breakdown voltage transistor is formed in the thin portion of the epitaxial layer, the emitter area necessary for maintaining $r_{SC}$ at the same level as in a low breakdown voltage integrated circuit should naturally be decreased as compared with the emitter area in the structure shown in FIG. 1.

As one method for preparing a semiconductor integrated structure as shown in FIG. 4, there can be mentioned a method comprising the steps (1) etching a predetermined region of a substrate to form a substrate having a dent 41, (2) forming a semiconductor layer only on the dent of the substrate by selective epitaxial growth and (3) forming a semiconductor layer on the entire surface by second epitaxial growth, whereby an integrated circuit comprising a substrate and, formed thereon, an epitaxially grown layer having a flat surface but differing in the thickness can be prepared (see Japanese Patent Publication No. 48955/1976).

According to this method, however, the epitaxial growth should be conducted two times and procedures of the selective epitaxial growth at the step (2) is complicated. Therefore, the method as a whole is not simple.

As another method for preparing a structure as shown in FIG. 4, there can be mentioned a method comprising (1) etching a predetermined region of a substrate 11 to form a substrate having a dent 41, (2) forming a semiconductor layer on the entire surface of the substrate inclusive of the dent by epitaxial growth, and (3) forming a mask on the bottom face of a secondary dent formed on the epitaxially grown layer by transfer of the dent 41 of the substrate and flattening the surface of the epitaxially grown layer by etching (see Japanese Patent Application Laid-Open Specifications No. 43369/77 and No. 69587/77). However, since in conventional semiconductor devices, a dent of a rectangular shape having sides parallel to the crystal axis <110> is formed, according to this method, in many cases, the surface of the epitaxially grown layer is not sufficiently flattened and convexities are readily formed around the mask of the secondary dent. Accordingly, etching or mechanical polishing should be further conducted for flattening the surface. Therefore, the method as a whole is complicated.

SUMMARY OF THE INVENTION

It is a primary object of the present invention to provide a semiconductor device comprising an epitaxial layer having a flat surface and including a thick region suitable for formation of high breakdown voltage elements and a thin region suitable for formation of low breakdown voltage elements, and a method for preparing such semiconductor device very simply.

Another object of the present invention is to provide a high breakdown voltage semiconductor integrated circuit which can be prepared at a low cost by a reduced number of process steps and a method for preparing such integrated circuit.

In accordance with one fundamental aspect of the present invention, there is provided a semiconductor device comprising a silicon substrate of one conductivity type having a surface on the (100) crystal plane or on a plane inclined within 5° against the (100) crystal plane, a polygonal dent formed on said silicon substrate and having main sides extending in a direction of the <100> crystal axis or in a direction inclined within 25° against the <100> crystal axis, a silicon layer of a conductivity type opposite to that of the silicon substrate formed on the entire surface of the substrate while filling up said dent, and a high breakdown voltage element formed in said silicon layer on said dent.

In accordance with another fundamental aspect of the present invention, there is provided a method for the preparation of semiconductor devices which comprises forming an oxide film on a silicon substrate having a surface on the (100) crystal plane or on a plane inclined within 5° against the (100) crystal plane, opening on said oxide film a polygonal window having main sides extending in a direction of the <100> crystal axis or in a direction inclined within 25° against the <100> crystal axis, etching the substrate with an anisotropic etching solution to form a dent on the substrate, forming an epitaxial layer filling up said dent on the entire surface of the substrate, masking only a secondary dent formed by transfer of the dent of the substrate, and etching the epitaxial layer with an anisotropic etching solution to substantially flatten the surface of the epitaxial layer.

BRIEF DESCRIPTION OF THE DRAWING

FIGS. 9-A to 9-E are sectional views of the device illustrating the steps of preparing another embodiment of the high breakdown voltage integrated circuit of the present invention.

FIG. 11-B is a view showing the section taken along the line I-I' in FIG. 11-A.

FIG. 11-C is a view showing the section taken along the line II-II' in FIG. 11-A.

FIG. 12-B is a sectional view of the dent shown in FIG. 12-A.

DETAILED DESCRIPTION OF THE PREFERRED EMBODIMENTS

The present invention will now be described by reference to embodiments illustrated in the accompanying drawings.

An embodiment in which a high breakdown voltage transistor having a breakdown voltage ($BV_{CEO}$) of 150 V between the collector and emitter and a low breakdown voltage transistor (small signal) of $BV_{CEO}=15$ V are integrated on one substrate is first described.

Necessary resistivity $\rho_{EP}$ and thickness $t_{EP}$ of the epitaxial layer are first illustrated. In order to form a high breakdown voltage transistor having the above-mentioned collector-emitter breakdown voltage, if a maximum value of the DC current gain $h_{FE}$ of the transistor is 200, $\rho_{EP}$ should be at least $12\Omega$—cm, and therefore, it is set at $15\Omega$—cm to provide an allowance for the deviation or error in the process steps is taken into account. In this case, the thickness of the epitaxial layer is set at 30 μm in view of the depletion layer extending at a base-collector reverse bias voltage of 150 V. When the thickness of the epitaxial layer on which the low breakdown voltage obtained if the thickness is about 10 μm.

Preparation of the structure of the above specification according to the method of the present invention will now be described by reference to FIGS. 5-A to 5-E.

Figure 1:
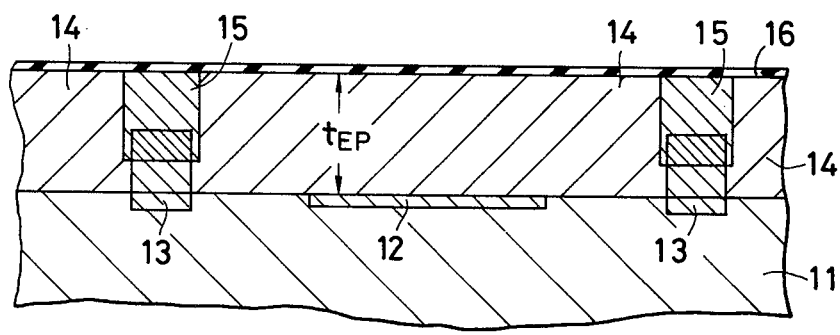
FIG. 1 is a view showing the sectional structure of a conventional low breakdown voltage integrated circuit.
Figure 2:
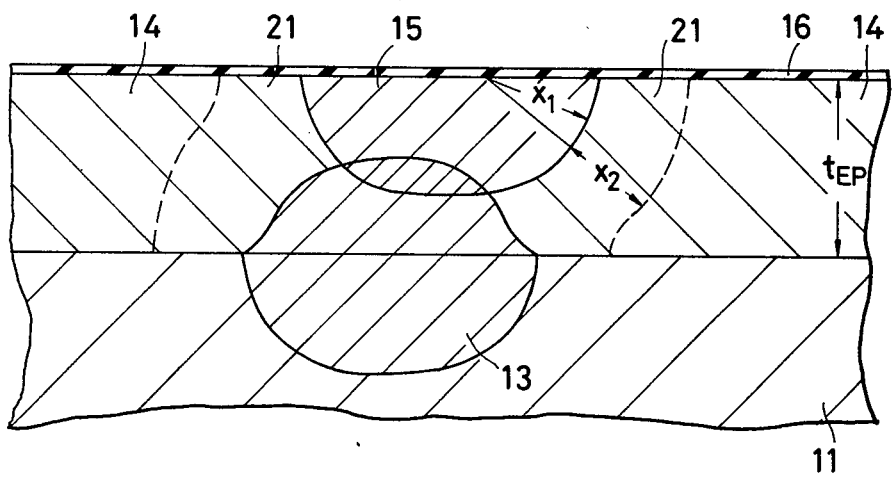
FIG. 2 is a sectional view illustrating the structure of a diffusion layer for isolation in the integrated circuit shown in FIG. 1.
Figure 3:
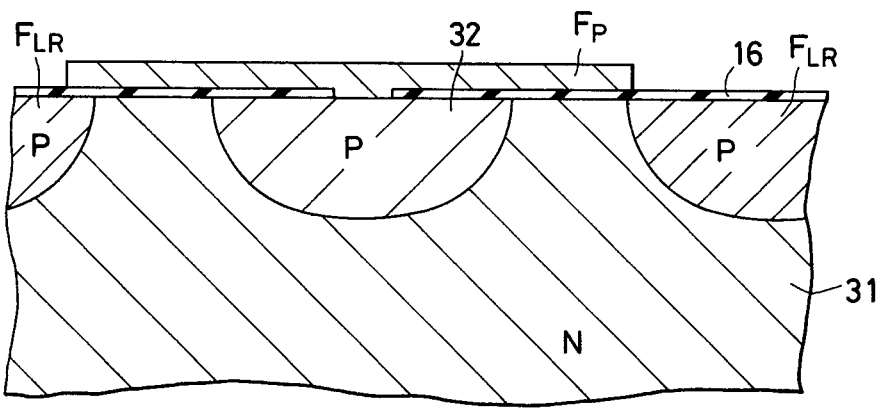
FIG. 3 is a sectional view showing the conventional device structure for improving the breakdown voltage of a PN junction.
Figure 4:
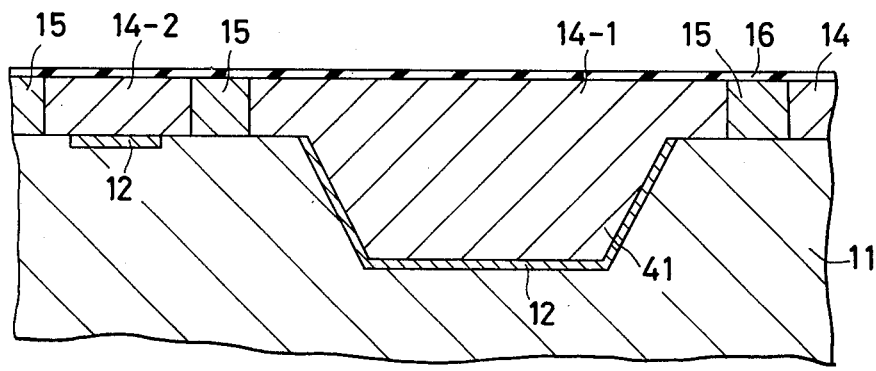
FIG. 4 is a view showing the sectional structure of a conventional high breakdown voltage integrated circuit, FIGS. 5-A to 5-E are sectional views of the device illustrating the steps of preparing one embodiment of the high breakdown voltage integrated circuit of the present invention.
Figure 5:
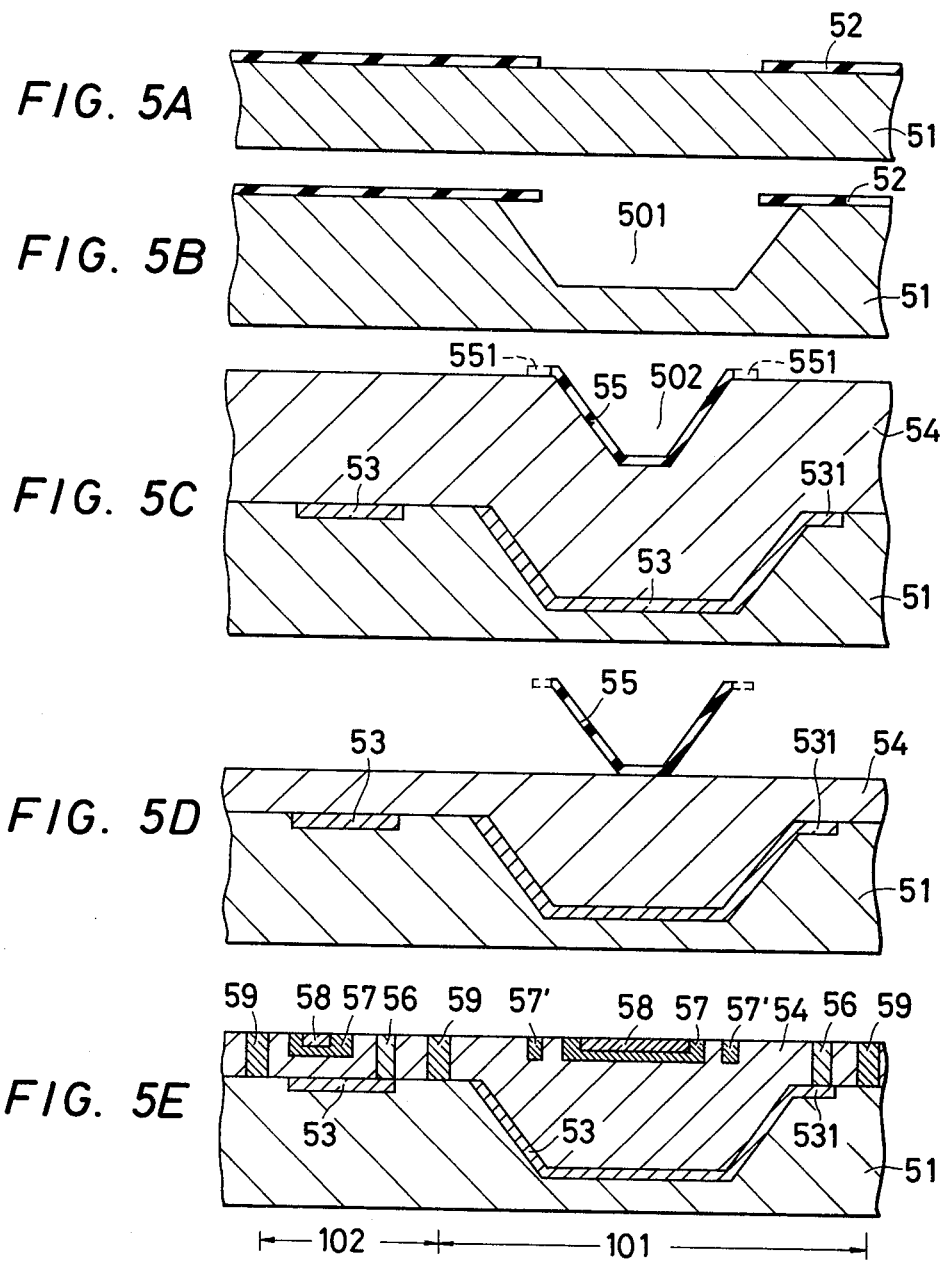

FIG. 5-A is a sectional view showing the structure obtained by forming an oxide film ($SiO_2$ film) 52 on a P type silicon substrate 51 having a surface on the (100) crystal plane and forming on this oxide film 52 is rectangular window having only sides parallel to the <100> crystal axis by the photo-etching process. In the subsequent Figs., these reference numeral represent the same elements.

Referring to FIG. 5-B, a dent 501 having a depth of about 20 μm is formed on the substrate by using an anisotropic etching solution. The etching solution is formed by incorporating in a 20% by weight aqueous solution of KOH isopropyl alcohol and a surface active agent FC-95 for preventing formation of pyramidal projections on the etched surface. Namely, the etching solution is prepared from 300 g of KOH, 1200 cc of pure water, 300 cc of isopropyl alcohol and 25 cc of a 0.1% aqueous solution of FC-95. In order to effect etching along 20 μm, about 50 minutes are required at a solution temperature of 70° C. When this etching solution is used. This KOH etching solution, which is an alkaline etching solution, is an anisotropic etching solution having a higher etching speed to the (100) crystal plane.

Referring to FIG. 5-C, after formation of the above-mentioned dent 501, a buried N+ type diffusion layer 53 is formed and an epitaxial layer 54 of the N type is grown thereon of about 30 μm. Further, an oxide film ($SiO_2$ film or the like) 55 as an etching-masking material is formed by the hot etching process only on dent 502 of the epitaxial layer, which is formed by transfer of the dent of the substrate. The oxide film 55 may have a portion 551 covering the upper portion above the dent along about 5 to about 10 μm as indicated by a broken line in FIG. 5-C.

If the buried N+ type diffusion layer 53 has a portion 531 extending to the surface of the substrate in the vicinity of the dent, the subsequent steps are facilitated.

Referring to FIG. 5-D, the epitaxial layer on the low breakdown voltage side is etched by an anisotropic etching solution to flatten the surface. The resulting epitaxial layer has a thickness of 30 μm in the high breakdown voltage zone and a thickness of 10 μm in the low breakdown voltage zone. The etching is carried out at a solution temperature of 70° C. for about 30 minutes by using a 40% by weight aqueous solution of KOH.

After the above-mentioned surface flattening, the oxide film 55 left after the etching operation is removed. Surface oxidation is conducted to form an $SiO_2$ film (not shown) on the surface of the epitaxial layer. A window for isolation diffusion is formed on the $SiO_2$ film by the photo-etching process. As shown in FIG. 5-E, the epitaxial layer is separated into a high breakdown voltage zone 101 and a low breakdown voltage zone 102 by the P type diffusion layer 59 for isolation. Subsequent steps are conducted in the same manner as in the process for preparing an ordinary linear integrated circuit, and an integrated circuit as shown in FIG. 5-E is obtained. Reference numeral 56 represents a collector punch-out N+ type diffusion layer connected to the buried layer 53 at the point of the portion 531, reference numeral 57 represents a P type base diffusion layer, reference numeral 57' represents a field-limiting P type diffusion layer, and reference numeral 58 represents an N+ type emitter diffusion layer.

In the method of the present invention, the convex-concave epitaxial surface is flattened by using an anisotropic etching solution.

Further, in the above-mentioned embodiment of the semiconductor device of the present invention, since a dent having a rectangular shape having only sides parallel to the <100> crystal axis is formed on the substrate, the epitaxial layer on the substrate can easily be flattened.

Figure 6:
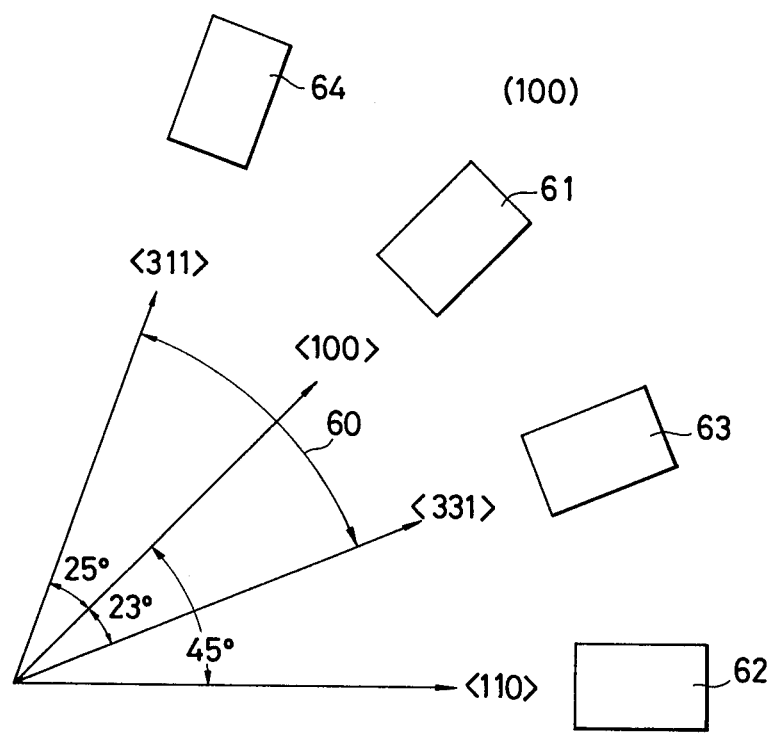
FIG. 6 is a diagram illustrating a pattern on a silicon wafer and the crystal axis direction on the side of the wafer.
Figure 7:
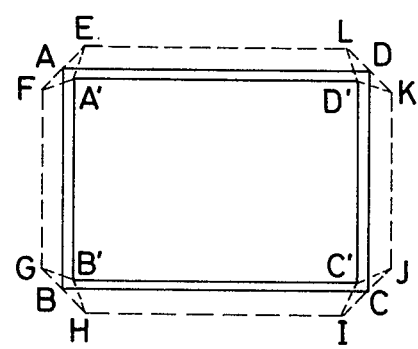
FIG. 7 is a plan view showing an etching pattern formed by conducting the etching while using the pattern 61 shown in FIG. 6 as an etching window.

FIG. 6 illustrates a rectangular pattern formed by masking a silicon wafer having a surface on the (100) crystal plane with an oxide film. In FIG. 6, a pattern 61 has sides parallel to the <100> crystal axis and a pattern 62 has sides parallel to the <100> crystal axis. A window for etching at the step shown in FIG. 5-B corresponds to the pattern 61 in FIG. 6, and a plan view of the structure formed by etching the silicon substrate through this window is shown in FIG. 7. The etching from the sides AB, BC, CD and DA parallel to the <100> crystal axis advances even below the oxide film 52 as shown in FIG. 5-B.

Etching from the four corners A, B, C and D of the rectangular pattern does not advance below the oxide film as shown in FIG. 7, but the etching forming the side passing through the corner A is performed and for example, a side EAF appears at the point of the corner A.

Namely, the dent formed by this etching has an octagonal shape AFGBHICJKDLE indicated by a dot line in FIG. 7 below the oxide film and a rectangular shape A'B'C'D' indicated by a solid line in FIG. 7 on the bottom face.

In case of the pattern 62 shown in FIG. 6, if etching is carried out by using the above-mentioned anisotropic etching solution, since the etching speed to the (111) crystal plane is low, etching does not advance below the oxide film but a dent having a rectangular bottom face on the (100) crystal plane surrounded by the inclined (111) crystal plane is formed.

Figure 8A:
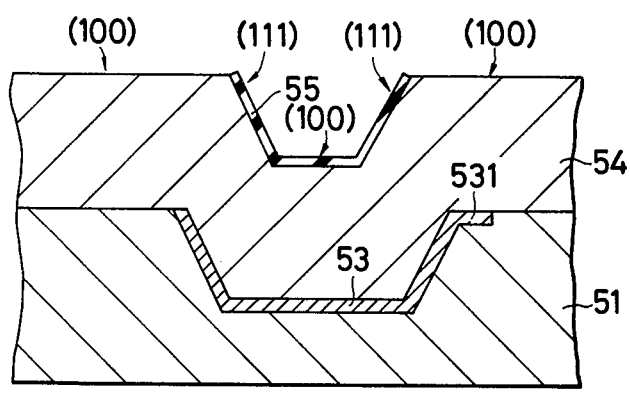
FIGS. 8-A and 8-B are sectional views of the device illustrating the flattening etching step using a pattern having sides parallel to the <110> crystal axis.
Figure 8B:
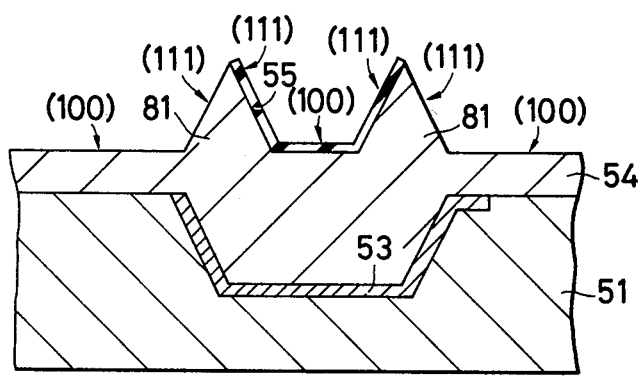

If the pattern defining the dent is the pattern 62 shown in FIG. 6, when etching is carried out by using the above-mentioned anisotropic etching solution, at the time of completion of the etching operation projections 81 surrounded by the (111) crystal plane are left as shown in FIGS. 8-A and 8-B, and therefore, it is impossible to flatten the surface. In contrast, if a rectangular pattern 61 having sides parallel to the <100> crystal axis as shown in FIG. 6 is employed, etching advances even below the oxide film as shown in FIG. 5-D and the inclined (111) plane does not appear, and therefore, the epitaxial layer can be flattened.

In case of a semiconductor device having a silicon layer formed by epitaxial growth on a silicon substrate having a dent formed thereon, flattening of the epitaxial silicon layer is possible not only when the rectangular pattern of the dent has sides parallel to the <100> crystal axis but also when the rectangular pattern of the dent has sides parallel to other directions. For example, in the case where the rectangular pattern of the dent has sides parallel to the <331> crystal axis like a pattern 63 shown in FIG. 6 or has sides parallel to the <311> crystal axis like a pattern 64 shown in FIG. 6, the epitaxial silicon layer can be flattened by the process steps shown in FIGS. 5-A to 5-E. In short, if a rectangular pattern of the dent has sides parallel to the <100> crystal axis or has sides parallel to a direction inclined within 25° against the <100> crystal axis, the epitaxial silicon layer can be flattened according to the process steps shown in FIGS. 5-A to 5-E. In the foregoing embodiment, the dent has a rectangular shape, but a dent having a polygonal pattern can be used in the present invention. Namely, if a polygonal pattern of the dent is formed so that it has main sides parallel to a direction included in the range indicated by referential numeral 60 in FIG. 6, the intended flattening of the epitaxial layer can be accomplished. Even if the polygonal pattern includes some sides parallel to a direction outside the range 60 and projections are left after completion of the etching operation, since such projections are very small, they can easily be removed in a very short time by conducting etching again after removal of the etching mask.

An embodiment in which an aqueous solution of KOH is used for formation of a dent by etching of a substrate will now be described.

A structure having the same specification as that of the above-mentioned embodiment is prepared according to the process steps illustrated in FIGS. 9-A to 9-E. Referring to FIG. 9-A, an oxide film 52 is formed on a silicon substrate 51 having a surface on the (100) crystal plane, and then, a window 91 having a rectangular shape having sides parallel to the <100> crystal axis is opened on the oxide film 52 by the photo-etching process. The section of the resulting structure is shown in FIG. 9-A. These referential numerals represent the same elements in the subsequent Figs.

Referring to FIG. 9-B, a dent 92 having a depth of about 20 μm is formed by using an anisotropic etching solution. A 40% by weight aqueous solution of KOH is used as the etching solution. In order to advance etching along 20 μm, about 35 minutes are necessary at a solution temperature of 70° C. when this etching solution is used.

Referring to FIG. 9-C, after formation of the above-mentioned dent, a buried N+ type diffusion layer 53 is formed and an N type epitaxial layer 54 is grown along 30 μm. Then, an oxide film 55 as an etching masking material is formed only on the dent by the customary photo-etching process. In this case, the oxide film 55 may have a portion 551 covering the upper portion above the dent along about 5 to about 10 μm as indicated by a broken line in FIG. 9-C.

Referring to FIG. 9-D, the epitaxial layer on the low breakdown voltage side is etched by using an anisotropic etching solution to flatten the surface. Thus, the resulting epitaxial layer has a thickness of 30 μm in the high breakdown voltage zone and a thickness of 10 μm in the low breakdown voltage zone. A 40% by weight aqueous solution of KOH is used as the etching solution, and the etching is conducted for about 30 minutes at a solution temperature of 70° C.

A mountain or projection 93 is left after completion of the etching operation in some cases. In such case, if the oxide film 55 is removed and the entire surface of the wafer is etched along about 5 μm by the above etching solution, the mountain 93 is removed and the surface is flattened.

After the above-mentioned flattening, the oxide film 55 left after the etching step shown in FIG. 9-D is removed and surface oxidation is carried out to form an oxide film (not shown). Then, a window for isolation diffusion is opened by the hot etching process. The epitaxial layer is separated into a high breakdown voltage zone 101 and a low breakdown voltage zone 102 by a diffusion layer 59 for isolation as shown in FIG. 9-E. Then, the subsequent preparation steps are conducted in the same manner as in the process for the preparation of ordinary linear integrated circuits, and an integrated circuit having a structure as shown in FIG. 9-E is obtained. Reference numeral 56 represents a collector punch-out N+ type diffusion layer, reference numeral 57 represents a base diffusion layer, and reference numeral 58 represents an emitter diffusion layer.

In the process for preparing the device of the present invention, a dent having a rectangular pattern having sides parallel to the <100> crystal axis is formed and etching is conducted by using an anisotropic etching solution, whereby the convex-concave surface of the epitaxial layer can be effectively flattened.

Figure 10:
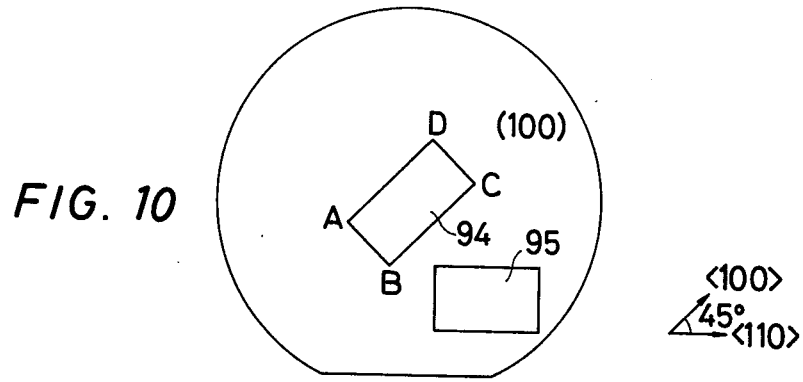
FIG. 10 is a diagram illustrating a pattern on a silicon wafer and the crystal axis direction on the side of the pattern.
Figure 11A:
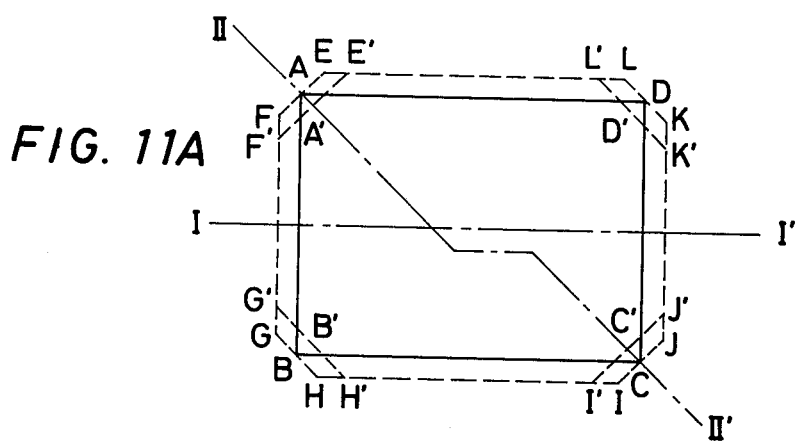
FIG. 11-A is a plan view showing an etching pattern formed by conducting the etching while using the pattern 94 shown in FIG. 10 as an etching window.
Figure 11B:
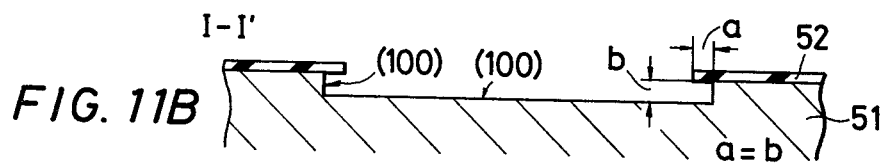
Figure 11C:
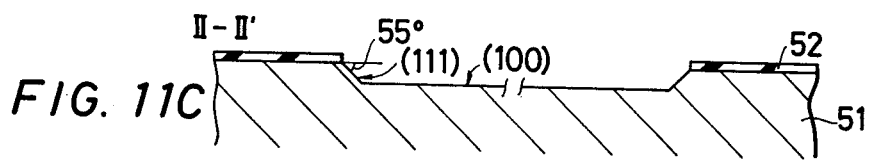

FIG. 10 illustrates a rectangular pattern masked with an oxide film on a silicon wafer having a surface on the (100) crystal plane. A pattern 94 has sides parallel to the <100> crystal axis and a pattern 95 has sides parallel to the <110> crystal axis. The etching window through which etching is conducted at the step shown in FIG. 9-B has a pattern like the pattern 94 in FIG. 10. FIG. 11-A is a plan view showing the structure obtained by etching the silicon substrate through this window. FIG. 11-B is a view showing the section taken along the line I-I' in FIG. 11-A and FIG. 11-C is a view illustrating the section taken along the line II-II' in FIG. 11-A. The etching from the sides AB, BC, CD and DA parallel to the <100> crystal axis advances even below the oxide film 52 along a distance substantially equal to the etching depth as shown in FIG. 9-B.

Etching from the four corners A, B, C and D of the rectangular pattern does not advance below the oxide film as shown in FIG. 9-B, but the etching forming the side passing through the corner A and being parallel to the <110> crystal axis is performed and for example, a side EAF appears at the point of the corner A.

Namely, the dent formed by this etching has an octagonal shape AFGBHICJKDLE indicated by a dot line in FIG. 11-A below the oxide film and an octagonal shape A'F'G'B'H'I'C'J'K'D'L'E' indicated by a dot line in FIG. 11-A also on the bottom face. In short, the dent having the bottom face on the (100) crystal plane and surrounded mainly by the (100) crystal plane is formed by the etching, and the (111) crystal plane appears at the four corners.

Figure 12A:
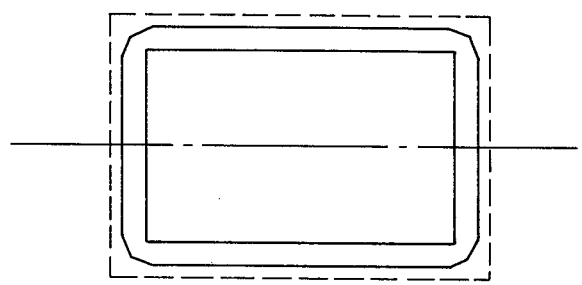
FIG. 12-A is a plan view illustrating the plane pattern of the dent shown in FIG. 11-A where the epitaxial growth was made.
Figure 12B:
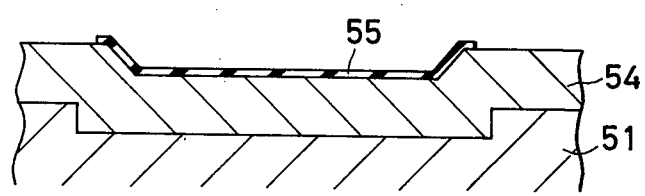

FIG. 12-A illustrates the plane pattern of the dent in the stage where the epitaxial layer 54 is formed and FIG. 12-B shows the sectional configuration of the dent in this stage. The first characteristic feature is that the epitaxial layer grown to have a step portion of 90° is converted to have a step portion having an angle of about 45°. The second characteristic feature is that the bottom face of the dent has an octagonal to substantially rectangular shape. By virtue of these characteristic features, if the dent is masked with the oxide film 55 and anisotropic etching is carried out, flattening is accomplished as shown in FIG. 9-D. Since the plane on which the etching advances at a high speed appears on the four corners shown in FIG. 12-A, even though these corners have a larger area to be etched than the peripheral portions, they are effectively etched and removed, and no mountain is left.

In case of the pattern 95 shown in FIG. 10, when the etching is carried out by using an anisotropic etching solution, the etching does not advance below the oxide film and a dent having the rectangular bottom face on the (100) crystal plane, which is surrounded by the inclined (111) crystal plane, is formed.

In the foregoing embodiments, a semiconductor crystal substrate having a surface on the (100) crystal plane is employed. In the present invention, there may be employed a substrate having a surface on a plane inclined within 5° (preferably 3° to 5°) against the (100) crystal plane. When a substrate having a surface on a plane inclined by 3° to 5° against the (100) crystal plane is employed, the crystalinity of the epitaxial layer can be improved.

A KOH etching solution included in the category of an alkaline etching solution is used as the anisotropic etching solution in the foregoing embodiment. As will be apparent to those skilled in the art, other known anisotropic solutions having a higher etching rate to the (100) crystal plane, such as NaOH type, hydrazine type, ethylene diamine type and ammonia type anisotropic etching solutions, can be used in tne present invention.

These anisotropic etching solutions are described in detail in M. J. Declerg et al.; Journal of Electrochemical Society, Solid-State Science and Technology, April 1975, pages 542 to 552, and D. W. Weirauch; Journal of applied Physics, Vol. 46, No. 4, April 1975, pages 1478 to 1483.

As will be apparent from the foregoing illustration, according to the above-mentioned preparation process of the present invention, a semiconductor device comprising an epitaxial layer having a flat surface but differing in the thickness can be obtained by two etching steps and one entire surface epitaxial growth step.

What is claimed is:

1. A semiconductor device comprising:
    a semiconductor substrate having a first conductivity type and having a surface on one of (a) the (100) crystal plane and (b) a plane inclined within 5° against the (100) crystal plane;
    a dent provided on a surface region of said substrate;
    a highly doped layer having a second conductivity type opposite to the first conductivity type, provided on a surface region of said substrate in a portion of said dent and extending on a surface region of said substrate from a peripheral portion of said dent; and
    a semiconductor layer having the second conductivity type, having a lower impurity concentration than that of said highly doped layer and provided on the surface of said substrate, said semiconductor layer filling up said dent and having a substantially flat surface, thereby said semiconductor layer having a thick portion on said dent and a thin portion on the surface of said substrate other than said dent,
    wherein said dent has a polygonal shape having main sides, each of which is parallel to at least one specific direction selected from a direction of the <100> crystal axis and directions inclined within 25° against the <100> crystal axis.

2. A semiconductor device as set forth in claim 1, wherein a highly doped region having the second conductivity type and having a higher impurity concentration than that of said semiconductor layer is provided so as to extend from the surface of said semiconductor layer to the extended portion of said highly doped layer in the peripheral portion of said dent.

3. A semiconductor device comprising:
    a semiconductor substrate having a first conductivity type and having a surface on one of (a) the (100) crystal plane and (b) a plane inclined within 5° against the (100) crystal plane;
    a dent provided on a surface region of said substrate;
    a highly doped layer having a second conductivity type opposite to the first conductivity type, provided on a surface region of said substrate in a portion of said dent and extending on a surface region of said substrate from a peripheral portion of said dent; and
    a semiconductor layer having the second conductivity type, having a lower impurity concentration than that of said highly doped layer and provided on the surface of said substrate, said semiconductor layer filling up said dent and having a substantially flat surface, thereby said semiconductor layer having a thick portion on said dent and a thin portion on the surface of said substrate other than said dent, and
    means to prevent inclined planes from appearing above said substantially flat surface during etching, comprising said dent with a polygonal shape having main sides, each of which is parallel to at least one specific direction selected from a direction of the <100> crystal axis and directions inclined within 25° against the <100> crystal axis.

4. A semiconductor device as set forth in claim 1 wherein said substrate is a silicon substrate of one conductor type and the semiconductor layer is an epitaxial silicon layer of a conductor type opposite to that of the substrate.

5. A semiconductor device as set forth in claim 4 wherein an impurity zone of the same conductor type as that of the substrate is formed so that said impurity zone extends from the surface of the epitaxial silicon layer to the surface of the substrate outside said dent and an island region is formed so that the island region is surrounded by said impurity zone and independently separated in the epitaxial silicon layer.

6. A semiconductor device as set forth in claim 5 wherein a semiconductor element requiring a high breakdown voltage is mounted on a first island region composed of the thick portion of the epitaxial silicon layer on said dent.

7. A semiconductor device as set forth in claim 5 or 6 wherein a semiconductor element not requiring a high breakdown voltage is mounted on a second island region composed of the thin portion of the epitaxial silicon layer outside said dent.

* * * * *